United States Patent
Shimada et al.

(10) Patent No.: US 8,563,977 B2
(45) Date of Patent: Oct. 22, 2013

(54) THIN FILM TRANSISTOR HAVING A TWO-LAYER SEMICONDUCTOR WITH COLUMNAR STRUCTURES, MANUFACTURING METHOD THEREFOR, AND DISPLAY APPARATUS USING THE SAME

(75) Inventors: Mikio Shimada, Kawasaki (JP); Ryo Hayashi, Yokohama (JP); Hideya Kumomi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 12/672,103

(22) PCT Filed: Sep. 18, 2008

(86) PCT No.: PCT/JP2008/067363
§ 371 (c)(1),
(2), (4) Date: Feb. 4, 2010

(87) PCT Pub. No.: WO2009/041544
PCT Pub. Date: Apr. 2, 2009

(65) Prior Publication Data
US 2010/0213459 A1    Aug. 26, 2010

(30) Foreign Application Priority Data

Sep. 28, 2007 (JP) ................. 2007-254364
Jul. 30, 2008 (JP) ................. 2008-196038

(51) Int. Cl.
*H01L 33/16* (2010.01)
*H01L 33/00* (2010.01)
(52) U.S. Cl.
CPC ............ *H01L 33/16* (2013.01); *H01L 33/0054* (2013.01)
USPC ................ 257/59; 257/E33.004; 438/482

(58) Field of Classification Search
CPC ........................... H01L 33/16; H01L 33/0054
USPC ................ 257/59, E33.004; 438/482
See application file for complete search history.

(56) References Cited

U.S. PATENT DOCUMENTS 7,145,174 B2    12/2006  Chiang et al. .................. 257/59
7,189,992 B2     3/2007  Wager, III et al. ............. 257/43

(Continued)

FOREIGN PATENT DOCUMENTS

JP    05-299657    11/1993
JP    07-058336     3/1995

(Continued)

OTHER PUBLICATIONS

Chinese Office Action dated May 24, 2011, issued in counterpart Chinese Patent Application No. 200880108292.3.
Korean Office Action dated Jul. 25, 2011, issued in counterpart Korean Patent Application No. 10-2010-7008596, with translation.
Korean Office Action dated Jul. 25, 2011, issued in counterpart Korean Patent Application No. 10-2010-7008596.

(Continued)

*Primary Examiner* — Fernando L Toledo
*Assistant Examiner* — Peter Bradford
(74) *Attorney, Agent, or Firm* — Fitzpatrick, Cella, Harper & Scinto

(57) ABSTRACT

A transistor is constituted of a gate electrode 2, a gate insulation layer 3, a semiconductor layer 4 formed of an amorphous oxide, a source electrode 5, a drain electrode 6 and a protective layer 7. The protective layer 7 is provided on the semiconductor layer 4 in contact with the semiconductor layer 4, and the semiconductor layer 4 includes a first layer at least functioning as a channel layer and a second layer having higher resistance than the first layer. The first layer is provided on the gate electrode 2 side of the semiconductor layer 4 and the second layer is provided on the protective layer 7 side of the semiconductor layer 4.

6 Claims, 8 Drawing Sheets

(56) References Cited

U.S. PATENT DOCUMENTS

| | | |
|---|---|---|
| 7,242,039 B2 | 7/2007 | Hoffman et al. ............... 257/213 |
| 7,282,782 B2 | 10/2007 | Hoffman et al. ............... 257/613 |
| 7,297,977 B2 | 11/2007 | Hoffman et al. ................ 257/43 |
| 2003/0155597 A1* | 8/2003 | Bachhofer et al. ............ 257/295 |
| 2004/0246765 A1 | 12/2004 | Kato |
| 2006/0108636 A1 | 5/2006 | Sano et al. ..................... 257/347 |
| 2006/0110867 A1 | 5/2006 | Yabuta et al. |
| 2006/0244107 A1 | 11/2006 | Sugihara et al. ............... 257/646 |
| 2007/0052025 A1 | 3/2007 | Yabuta ........................... 257/347 |
| 2007/0194379 A1 | 8/2007 | Hosono et al. ................. 257/347 |
| 2009/0090915 A1* | 4/2009 | Yamazaki et al. .............. 257/66 |
| 2010/0019656 A1* | 1/2010 | Yu et al. ......................... 313/504 |
| 2010/0213459 A1 | 8/2010 | Shimada et al. |
| 2012/0132911 A1 | 5/2012 | Shimada et al. |

FOREIGN PATENT DOCUMENTS

| | | | |
|---|---|---|---|
| JP | | 11284191 A | * 10/1999 |
| JP | | 04759598 B2 | 8/2011 |
| WO | WO 2005/074038 A1 | | 8/2005 |
| WO | WO 2008/105250 A1 | | 9/2008 |

OTHER PUBLICATIONS

Nomura et. al., "Room-Temperature Fabrication of Transparent Flexible Thin-Film Transistors Using Amorphous Oxide Semiconductors", *Nature*, vol. 432, p. 488 (2004).

Office Action issued on Mar. 28, 2012, in counterpart Taiwan application No. 097136880.

Office Action issued on Feb. 19, 2013, in counterpart Japanese application No. 2011-031543.

* cited by examiner $$D = \frac{D_{In2O3} + D_{Ga2O3} \times \frac{C_{Ga}}{C_{In}} + D_{ZnO} \times \frac{C_{Zn}}{C_{In}}}{1 + \frac{C_{Ga}}{C_{In}} + \frac{C_{Zn}}{C_{In}}}$$

HAVING NO COLUMNAR STRUCTURE

HAVING COLUMNAR STRUCTURE

FIG. 8

|  | TFT HAVING NO COLUMNAR STRUCTURE PROVIDED WITH NO PROTECTIVE LAYER | TFT HAVING NO COLUMNAR STRUCTURE PROVIDED WITH PROTECTIVE LAYER | TFT ACCORDING TO PRESENT INVENTION |
|---|---|---|---|
| STANDARD DEVIATION $V_{on}$ | 0.13 | 0.83 | 0.12 |

|  | TFT HAVING NO COLUMNAR STRUCTURE PROVIDED WITH NO PROTECTIVE LAYER | TFT HAVING NO COLUMNAR STRUCTURE PROVIDED WITH PROTECTIVE LAYER | TFT ACCORDING TO PRESENT INVENTION |
|---|---|---|---|
| STANDARD DEVIATION $V_{on}$ | 0.13 V | 0.83 V | 0.12 V |

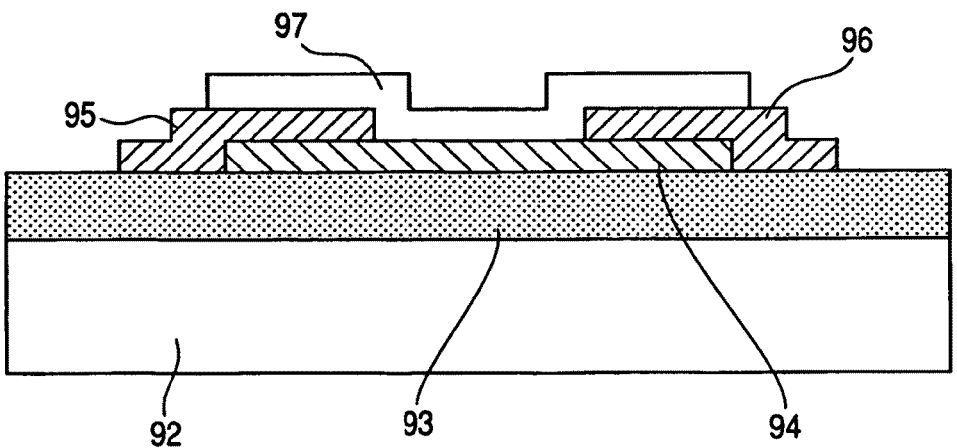

FIG. 9

THIN FILM TRANSISTOR HAVING A TWO-LAYER SEMICONDUCTOR WITH COLUMNAR STRUCTURES, MANUFACTURING METHOD THEREFOR, AND DISPLAY APPARATUS USING THE SAME

TECHNICAL FIELD

The present invention relates to a thin film transistor, a manufacturing method therefor, and a display apparatus using the same, and particularly to a thin film transistor which has improved dispersion of characteristics among TFTs, a manufacturing method therefor, and a display apparatus using the same.

BACKGROUND ART

In recent years, developments have proceeded on a TFT which uses a transparent oxide semiconductor as an active layer.

US2006/108636 A1 discloses a technology on a TFT which uses an amorphous transparent oxide semiconductor film (IGZO film) including In, Ga, Zn and O as an active layer.

The above described thin film transistor has received attention, because the film is transparent and can be formed at a low temperature, and a transparent TFT can be formed on a substrate having flexibility such as a plastic.

US2007/052025 A1 discloses a technology of enhancing environment stableness by providing a protection film on a TFT which has an amorphous IGZO film as an active layer.

DISCLOSURE OF THE INVENTION

It is known that an oxide semiconductor changes its semiconductor characteristics through adsorbing water in ambient atmosphere.

With respect to the problem, US2007/052025 A1 discloses a trial of covering a semiconductor layer with a protective layer to inhibit an unstable operation due to a change of the ambient atmosphere. Such a technology can inhibit the unstable operation due to the change of the ambient atmosphere to some extent.

However, it has been found that a bottom gate type TFT occasionally produces the dispersion of the characteristics among a plurality of TFTs manufactured at the same time, which has not been observed at a stage before the protective layer is formed.

In addition, when an active matrix type of a display apparatus employs the TFT which produces such a dispersion of the characteristics, the apparatus has caused the ununiformity of the displayed image. The present inventors understand the mechanism of the phenomenon as follows.

The bottom gate type TFT has the protective layer formed right on the semiconductor layer. When the protective layer is formed with a sputtering technique or the like, a region (partial layer) of the semiconductor layer in contact with the protective layer may be occasionally damaged in the step of forming the protective layer. In this specification, a partial layer of the TFT semiconductor layer which is brought into contact with the above described protective layer is hereinafter referred to as a back channel layer.

On the other hand, it is known that the oxide semiconductor decreases its electric resistance when oxygen is deficient therein, because of generating a carrier.

In case of a TFT using an oxide semiconductor, a damaged layer which is ununiformly deep according to positions and has the low resistance can exist in the back channel layer of the semiconductor layer, due to the damage caused by such an oxygen deficiency. Such a damaged layer having the ununiform depth (thickness) is thought to be a factor of the dispersion of the characteristics among the TFTs.

Accordingly, an object of the present invention is to improve the dispersion of the characteristics among the TFTs due to the ununiformity of the damage which the semiconductor layer receives when the protective layer is formed with the sputtering technique, and to enhance the uniformity of the image in the active matrix type display apparatus which employs the improved TFT.

To solve the above described problem, the present invention provides a thin film transistor comprising a gate electrode, a gate insulation layer, a semiconductor layer formed of an amorphous oxide, a source electrode, a drain electrode and a protective layer, characterized in that the protective layer is provided on the semiconductor layer in contact with the semiconductor layer, and the semiconductor layer includes a first layer at least functioning as a channel layer and a second layer having higher resistance than the first layer, the second layer being provided on the protective layer side of the semiconductor layer.

The present invention also provides a method for manufacturing a thin film transistor comprising a gate electrode, a gate insulation layer, a semiconductor layer formed of an amorphous oxide, a source electrode, a drain electrode and a protective layer, characterized in that the method comprises the steps of forming the gate electrode, forming the gate insulation layer, forming the semiconductor layer, forming the source electrode and the drain electrode, and forming the protective layer, wherein the protective layer is provided on the semiconductor layer in contact with the semiconductor layer, the step of forming the semiconductor layer includes a step of forming a first layer at least functioning as a channel layer and a step of forming a second layer having higher resistance than the first layer, and the protective layer is formed in an oxidative atmosphere.

The present invention also provides a method for manufacturing a thin film transistor comprising a gate electrode, a gate insulation layer, a semiconductor layer formed of an amorphous oxide, a source electrode, a drain electrode and a protective layer, characterized in that the method comprises the steps of forming the gate electrode, forming the gate insulation layer, forming the semiconductor layer, forming the source electrode and the drain electrode, forming the protective layer, and carrying out a heat treatment in an oxidative atmosphere after the protective layer is formed, wherein the protective layer is provided on the semiconductor layer in contact with the semiconductor layer, and the step of carrying out the heat treatment includes a step of forming a first layer which is in contact with the gate insulation layer and at least functions as a channel layer and forming a second layer which is in contact with the protective layer and has higher resistance than the first layer, in the semiconductor layer.

A manufacturing method according to the present invention includes oxidizing the back channel layer of the semiconductor layer up to a deeper position than the damaged layer formed therein when the protective layer is formed. Thereby, the method oxidizes the damaged layer to passivate the damaged layer, and can effectively inhibit an adverse effect exerted on electrical conduction characteristics in the channel region of the thin film transistor. That is, the present invention can improve the dispersion of characteristics among the TFTs due to the ununiformity of damage which the semiconductor layer receives when the protective layer is formed with the sputtering method and enhance the uniformity of the image in the active matrix type display apparatus using the improved TFT.

As a result, the method can inhibit the dispersion of the characteristics among a plurality of the TFTs.

In addition, the present invention can provide an active matrix type display apparatus which shows a uniform image by using a pixel drive circuit constituted by TFTs according to the present invention.

Further features of the present invention will become apparent from the following description of exemplary embodiments with reference to the attached drawings.

BRIEF DESCRIPTION OF THE DRAWINGS

FIG. 8 is a table comparing the standard deviation of $V_{on}$ in 96 pieces of TFTs.

FIG. 9 is a sectional view of a bottom gate type TFT using an n-type Si substrate and being provided with a protective layer, which is one embodiment according to the present invention.

BEST MODES FOR CARRYING OUT THE INVENTION

Figures 1, 2:
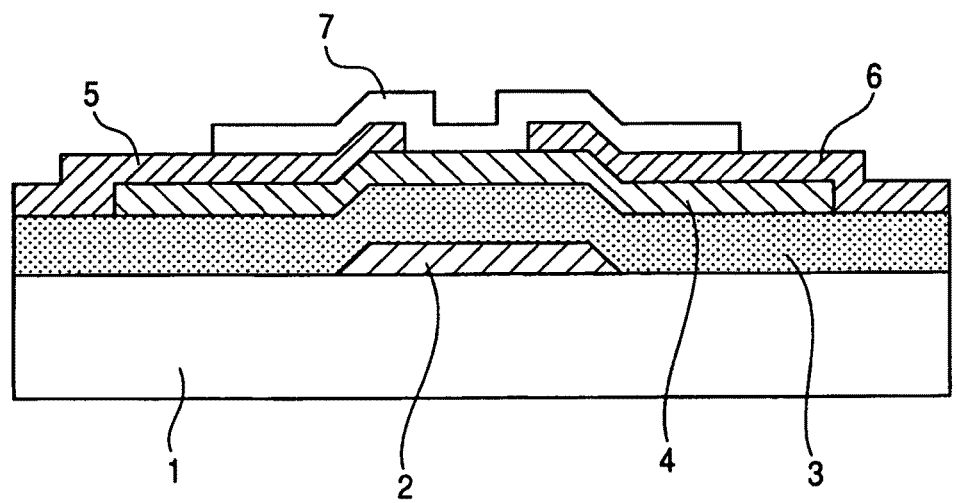
FIG. 1 is an expression showing a theoretical weighted density in consideration of a composition ratio while taking oxides including In, Ga and Zn as an example.
FIG. 2 is a sectional view of a bottom gate type TFT provided with a protective layer, which is one embodiment of the present invention.

Now, embodiments of a thin film transistor according to the present invention, a manufacturing method therefor and a display apparatus using the thin film transistor will be described below.

The thin film transistor according to the present embodiment is constituted of a gate electrode, a gate insulation layer, a semiconductor layer formed of an amorphous oxide, a source electrode, a drain electrode and a protective layer. The protective layer is provided on the semiconductor layer in contact with the semiconductor layer. The semiconductor layer includes a first layer at least functioning as a channel layer and a second layer having higher resistance than the first layer. The first layer is provided on the gate electrode side of the semiconductor layer and the second layer is provided on the protective layer side of the semiconductor layer. In the embodiment, the above first layer and second layer do not necessarily have to be provided in the form of "layers" independently of each other but may be formed as regions which are functionally separated. The present invention covers, for example, a case where two regions having substantially different functions are formed on one, continuous layer by changing the composition and structure in the direction of the layer thickness.

A first method for manufacturing a thin film transistor according to the present embodiment comprises the steps of forming the gate electrode, forming the gate insulation layer, forming the semiconductor layer, forming the source electrode and the drain electrode, and forming the protective layer. The protective layer is provided on the semiconductor layer in contact with the semiconductor layer. The step of forming the semiconductor layer includes a step of forming a first layer (region) at least functioning as a channel layer and a step of forming a second layer (region) having higher resistance than the first layer. The protective layer is formed in an oxidative atmosphere.

A second method for manufacturing a thin film transistor according to the present embodiment comprises the steps of forming the gate electrode, forming the gate insulation layer, forming the semiconductor layer, forming the source electrode and the drain electrode, and forming the protective layer. The method includes a step of carrying out a heat treatment in an oxidative atmosphere after the protective layer is formed. The protective layer is provided on the semiconductor layer in contact with the semiconductor layer, and the step of carrying out the heat treatment includes a step of forming a first layer (region) which is in contact with the gate insulation layer and at least functions as a channel layer and a second layer (region) which is in contact with the protective layer and has higher resistance than the first layer, in the semiconductor layer.

In the embodiment, it is preferable to make the mass density of a second layer not larger than the mass density of a first layer. With such a constitution, it is possible to make the depth of an oxidized part larger than the depth of a damaged part which is formed in a semiconductor layer when a protective layer is formed on the semiconductor layer. Accordingly, a layer having received the above described damage (referred to as damaged layer as well) is oxidized over the whole layer thickness direction. Thus, the above described damaged layer acquires high resistance by forming a second layer having high resistance, which can effectively inhibit the above described semiconductor layer from lowering the electric resistance. This is because the damaged layer acquires high resistance by being oxidized, and does not give adverse effect on the characteristics of the semiconductor. In the present invention, passivation is defined as a state in which the damaged layer is modified to have high resistance, and does not give adverse effect (no harmful effect) on the electric characteristics of the semiconductor layer.

In the embodiment, it is preferable to form the second layer into a columnar structure to realize the second layer having the above described low mass density. In other words, the second layer can acquire the above described low mass density by including a columnar structure originating from spaces of condensation and rarefaction among metal atoms, though having an amorphous structure in the whole. In a dense columnar structure body which is made of spaces of condensation and rarefaction among metal atoms, that is to say, is made of columns surrounded by boundaries having low mass density locally (in a state that columnar structures are heavily built-up), so-called enhanced oxidation occurs in the boundaries between adjacent columns, which have the low density, and the oxidation occurs from the boundary containing a high concentration of oxygen toward the inside of the columns. That is to say, an oxidation speed increases in a region of the boundary having the low density compared to a region of the boundary having high density. Thus, the oxidation speed increases in the second layer, and the damaged layer is converted into a passivated layer of high resistance by being wholly oxidized.

In the present embodiment, it is preferable to make the mass density of at least the second layer not larger than 90% of the mass density in a crystal state of the material constituting the layer. In this case, it is possible to make the oxidation speed in the second layer higher than an invasion speed of the damage. Here, the oxidation speed in the second layer means a speed of oxidation progressing in a unit time. The invasion speed of the damage means a speed of the damage invading into the inner part of the semiconductor layer (speed of forming oxygen deficiency or the like) when the protective layer is formed. By increasing the oxidation speed in the second layer compared to the invasion speed of the damage, the oxidation layer can be made thicker than the damaged layer (that is to say, damaged layer is made to be contained in the inner part of the oxidation layer which is a layer of high resistance).

The mass density in the crystal state of the constituting material in the present embodiment is expressed by D shown in FIG. 1, when an oxide formed of In, GA and Zn is taken as an example for description. Here, $D_{In2O3}$, $D_{Ga2O3}$ and $D_{ZnO}$ represent densities of single crystals of $In_2O_3$, $Ga_2O_3$ and ZnO respectively. In addition, $C_{Ga}/C_{In}$ and $C_{Zn}/C_{In}$ represent composition ratios of Ga to In, and Zn to In respectively.

Next, a condition on a diameter of the column and a layer thickness of the semiconductor layer for making the enhanced oxidation effective in this columnar structure will now be described below. In the present embodiment, an average value of the diameters of columns forming a columnar structure is preferably made not larger than ⅔ of the thickness of the above described semiconductor layer. In this case, the second layer can be effectively oxidized. The speed of oxidation progressing in a radial direction from the boundary of the columnar structure is the same regardless of the particle diameter. However, when the columnar structure has a large diameter, a unoxided region remains in the central part of the column so that the columnar structure cannot be uniformly made to have high resistance. On the other hand, when the columnar structure has a small diameter, oxidation progresses into the central part of the column, so that the columnar structure can be uniformly oxidized and acquire high resistance.

In the present embodiment, the above described second layer can acquire high resistance more easily when the above described second layer has smaller mass density than the first layer. However, if the diameter of the columnar structure is made smaller and the layer having acquired high resistance due to oxidization can be made as deep as the damaged layer at least or can be formed more deeply than the damaged layer, the mass density of the second layer can be made equal to that of the first layer, as well. Accordingly, the columnar structure is not limitedly formed only in the second layer, but the first layer may include a similar columnar structure.

In the present embodiment, the above described effect can be enhanced by selecting a material for an amorphous oxide semiconductor layer as a material of a semiconductor layer and optimizing the composition.

The present embodiment also can passiviate a damaged layer by carrying out a heat treatment in an oxidative atmosphere, and thereby oxidizing the semiconductor layer up to a deeper layer than the damaged layer which has been formed from the surface in the semiconductor layer when the protective layer has been formed on the semiconductor layer.

In the present embodiment, the damaged layer that has been formed when the protective layer has been formed is oxidized into a second layer that is passivated and acquires high resistance, and in this case, the electric characteristics are determined only by a first layer which works as an effective channel layer of the thin film transistor. Thereby, the dispersion of the characteristics among a plurality of TFTs can be inhibited even when the damaged layer has an ununiform thickness in the plane, because the damaged layer is passivated by oxidation.

According to the present embodiment, the oxidation treatment is carried out to progress up to a deeper position than the damaged layer formed in the back channel layer of the semiconductor layer when the protective layer is formed. Thereby, the damaged layer is passivated by oxidation and the adverse effect exerted on electrical conduction characteristics in the channel region of the thin film transistor can be effectively inhibited. As a result, the dispersion of the characteristics among a plurality of TFTs can be well inhibited.

Also, an active matrix type display apparatus which makes use of a pixel drive circuit constituted by TFTs according to the present invention can enable a display apparatus showing a uniform image to be provided.

Next, embodiments of a thin film transistor according to the present invention, a manufacturing method therefor and a display apparatus using the thin film transistor will be described with reference to the attached drawings.

FIG. 2 is a schematic sectional view illustrating a structure of a bottom gate type TFT provided with a protective layer, which is one embodiment of the present invention.

The bottom gate type TFT provided with the protective layer according to the present embodiment is formed by stacking a gate electrode 2, a gate insulation layer 3, a semiconductor layer 4, a source electrode 5, a drain electrode 6 and a protective layer 7 on a substrate 1, as is illustrated in FIG. 2.

A glass substrate is used for the substrate 1. A plastic film made of polyethylene terephthalate (PET), polyethylene naphthalate (PEN) or the like can also be used for the substrate 1.

The gate electrode 2 is stacked on the substrate 1. The gate electrode 2 can employ a metal such as Ti, Mo, W, Al and Au, and an electroconductive oxide such as ITO (indium tin oxide). An alloy such as Mo—W can also be used for the metal. In addition, a stacked body of metals, which is prepared by sandwiching a metal such as Ti, Al and Au, having adequate adhesiveness to the oxide, can be used as the electrode in order to enhance the adhesiveness of the film.

The gate insulation layer 3 is stacked on the substrate 1 and the gate electrode 2. The gate insulation layer 3 can employ an Si oxide and an Si nitride such as $SiO_x$, SiN and SiON. The gate insulation layer 3 can also employ an oxide and a nitride of another metal element other than Si, for instance, $Al_2O_3$, AlN or the like.

The semiconductor layer 4 is stacked on the gate insulation layer 3. An oxide semiconductor containing at least one of In, Ga and Zn is used for the semiconductor layer 4. The structure of the semiconductor layer 4 will be described later.

The source electrode 5 and the drain electrode 6 are stacked on the semiconductor layer 4. The source electrode 5 and the drain electrode 6 can employ a metal and an electroconductive oxide similar to those of the gate electrode 2.

An alloy such as Mo—W can also be used as the metal similarly in the gate electrode 2. In addition, a stacked body of Ti and another metal, for instance, can be used for the purpose of enhancing a mechanical adhesiveness or an electrical contact to the oxide semiconductor.

When any electrode employs a metal-stacked body, the metal-stacked body can make a metal which forms an interface with an adjacent layer and a metal for transporting an electric charge to the interface or applying voltage share a role of the electrode.

The protective layer 7 is stacked on the source electrode 5, the drain electrode 6 and the semiconductor layer 4. The protective layer 7 is formed in an oxidative atmosphere in order to oxidize the back channel of the semiconductor layer 4. An insulative metal oxide such as silicon oxide and silicon oxynitride can be used for the protective layer 7.

The product structure after the protective layer 7 has been formed thereon may be subjected to a heat treatment in an oxidative atmosphere of oxygen, a mixture gas of oxygen and nitrogen or the like, typically at a temperature in the range of 100° C. to 300° C. approximately for several minutes to one hour.

When the semiconductor layer 4 is covered with the protective layer 7 made of an oxide, a subsequent film-forming step after the step of forming the protective layer does not give influence on the oxidized state of the semiconductor layer 4.

Accordingly, a stronger protective layer against the oxidative atmosphere can be formed by further providing an additional protective layer of a metal nitride or the like on the protective layer 7.

The source electrode 5 and the drain electrode 6 may be formed after the protective layer 7 has been formed on the semiconductor layer 4 and patterned, though this does not directly relate to the effect of the present invention.

In this case, the semiconductor layer 4 is covered with the protective layer 7, so that an operation of patterning the source electrode 5 and the drain electrode 6 through an etching process gives little damage to the semiconductor layer 4.

(Concerning the Semiconductor Layer)

A structure of the semiconductor layer 4 will now be described below in detail with reference to FIG. 10.

Figure 10:
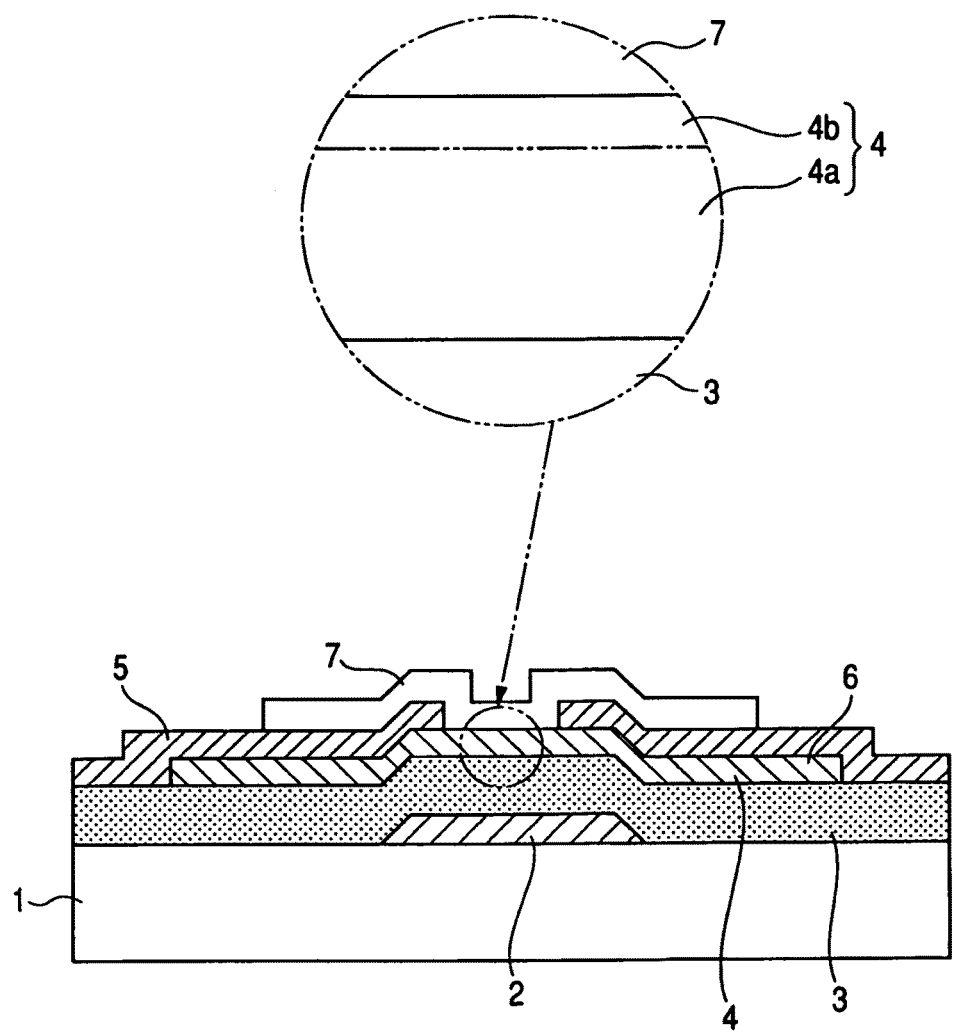
FIG. 10 is a sectional view of a bottom gate type TFT provided with a protective layer, which is one embodiment of the present invention, and includes an expanded sectional view of a portion of the TFT.

As illustrated in FIG. 10, one of preferred embodiments according to the present invention has a structure comprising the semiconductor layer 4 including a first layer 4a which functions at least as a channel layer (semiconductor active region) and a second layer 4b which has higher resistance than the first layer. The first layer 4a is provided on the gate electrode 2 side of the semiconductor layer 4, and the second layer 4b is provided on the protective layer side of the semiconductor layer 4.

The second layer 4b is formed so as to have lower mass density than the first layer 4a and include a region (damage layer) of a back channel layer in the semiconductor layer 4 which will receive damage when the protective layer 7 is formed thereon.

While the semiconductor layer 4 is divided into two layers, this means that the semiconductor layer is functionally separated into two regions in terms of the electric characteristics. That is, even when the semiconductor layer is constituted by one layer, two regions functionally separated may exist in the inside of the layer and a morphologically clear boundary may not necessarily exist between the two regions.

The key point of the present invention is to provide a state of making oxygen easily diffuse therethrough in a back channel layer contained in the second layer 4b of the semiconductor layer 4, and to oxidize not only the surface but also a deeper layer than the thickness of a layer into which the damage invades from the surface of the semiconductor layer 4 when the protective layer is formed.

Thereby, a layer (damaged layer) of the semiconductor layer 4 into which the damage has invaded is oxidized to acquire high resistance and to be passivated.

Accordingly, even when the damage has invaded into the semiconductor layer 4 ununiformly from site to site in the plane of the substrate (even when the thickness of the damaged layer is ununiform), a layer out of the back channel layer, which has been damaged and converted to have low resistance, is wholly passivated, and does not cause the ununiformity of TFT characteristics.

A diffusion phenomenon of atoms in a crystal depends on a frequency of jumping of the atoms to the adjacent site. When there is a vacancy in the crystal, a potential barrier for the atoms to jump is generally lowered, and the atoms tend to more frequently jump to their adjacent site (atoms easily jump to adjacent site).

In other words, the atoms easily diffuse through the vacancies. Similarly, it is a condition for atoms to easily diffuse even in such an amorphous as not to have a clear lattice site that the amorphous has low mass density and has vacant space of an atomic level.

When the above description is applied to the case of the present invention, the above diffusion phenomenon corresponds to a phenomenon in which oxygen atoms easily diffuse in the second layer 4b having the low mass density from the surface and increase an oxidation speed, when the protective layer 7 is formed under an oxidative condition or when a heat treatment is carried out in an oxidative atmosphere after the protective layer 7 has been formed.

The second layer 4b can be formed so as to acquire lower mass density than the first layer 4a, by changing the film-forming conditions on the way of a process for forming the semiconductor layer 7. A double-layer structure each having different mass density can be realized, for instance, by forming the first layer 4a through a sputtering technique which can form a film having relatively high mass density, and then forming a second layer 4b through a pulsed laser deposition (PLD) technique which can form a film having relatively low mass density.

It is more desirable that the second layer 4b is formed so as to have mass density not larger than 90% of the mass density in a crystal state of the material constituting the layer.

When an amorphous oxide semiconductor film is formed, for example, with the PLD technique, the film with a low density not larger than 90% of the mass density in the crystal state can be formed by increasing the film-forming pressure. For example, a film-forming pressure of not higher than 1 Pa provides a film with a mass density of 92 to 93% of the mass density in the crystal state, and a film-forming pressure of not lower than 5 to 6 Pa provides a film with a mass density of 82 to 84% of the mass density in the crystal state.

On the contrary, the amorphous oxide semiconductor film formed with the sputtering technique acquires a mass density of approximately 93 to 94% of the mass density in the crystal state. Accordingly, the double-layer structure each having different mass density is formed by stacking the amorphous oxide semiconductor layer formed with the PLD technique on the amorphous oxide semiconductor layer formed with the sputtering technique. Also, when the semiconductor layer 7 is formed only with the sputtering technique, the first layer 4a having high mass density and the second layer 4b having low mass density can be realized by decreasing the power density during film formation.

In addition, one of preferred embodiments according to the present invention has a structure including a columnar structure at least in a second layer 4b. This embodiment will now be described below.

It is known that in a polycrystal an atom diffuses in a crystal grain boundary (grain boundary diffusion) at a larger diffusion speed than in a crystal grain (lattice diffusion). This is because atom density is lower in the crystal grain boundary than in the crystal grain. Similarly, also in the amorphous, when there exists a boundary having low atom density, the atom diffuses at a larger diffusion speed in a direction along the boundary.

The amorphous film is generally considered to be uniform, but macroscopically can take a columnar structure. This columnar structure means a structure which shows a disordered arrangement of atoms and is amorphous, but does not show uniform atom density or mass density spatially, and in which columns having high density are in contact with each other through a boundary region having low density.

A process through which the columnar structure is formed in the amorphous film will now be described below. An atom which has been sputtered from a target material and has flown therefrom collides against a substrate and deposits thereon. Then, the atom diffuses on the surface of the substrate, and is fixed on the surface. Atoms flying from the target in an early period of the film-forming step do not deposit uniformly, but form an island-shaped structure, and the deposition surface has fine unevenness thereon.

The fine unevenness shows a shadowing effect on next flying atom. In other words, the flying atom comes into a region located in a shadow of a salient at a lower probability because the region is covered with the salient. For this reason, when the atom on the deposition surface has small kinetic energy and a diffusing distance on the surface is shorter than the diameter of the island, few atoms reach a valley of the unevenness. Once formed unevenness strengthens the shadowing effect as the deposition progresses, the film grows so that the unevenness of the surface is emphasized.

As the film further grows, the valley part is left from a circumferential part to form a boundary having low density. Thus, the amorphous film changes from an island-shaped structure to a layer having a columnar structure with a boundary region having low density.

The columnar structure of the amorphous is formed while being influenced by the roughness of an underlayer. When the underlayer is flat, the columnar structure is not formed in the early period of the film-forming step. After the deposition has progressed to some film thickness, the columnar structure becomes confirmable. On the other hand, when the surface to be deposited thereon in the earliest period has unevenness, the columnar structure is formed from the early period of the film-forming step so that the unevenness is succeeded. This is considered to be because the structure of the deposited layer is influenced by the surface roughness of the underlayer.

Accordingly, as is described above, the formation of the columnar structure can be induced or promoted, for instance, by lowering a sputter film-forming power during forming a film for the semiconductor layer, and decreasing the kinetic energy of the atom deposited on the substrate, and by extension a diffusion distance of the atom. The formation of the columnar structure can be induced or promoted also by providing the unevenness on the surface to be deposited thereon.

Figure 4A:
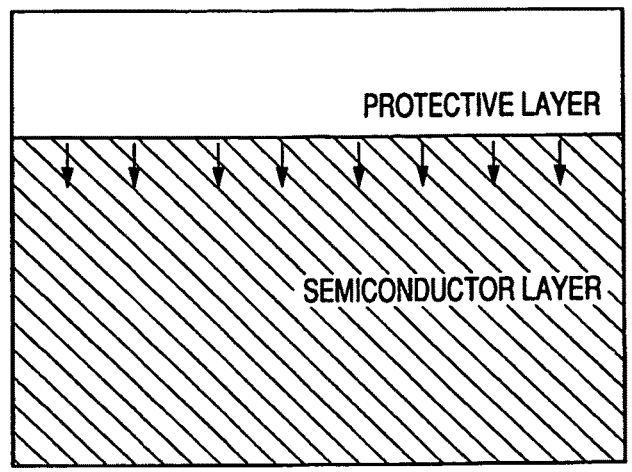
FIGS. 4A and 4B are schematic sectional views illustrating a proceeding state of the oxidization of a semiconductor layer.
Figure 4B:
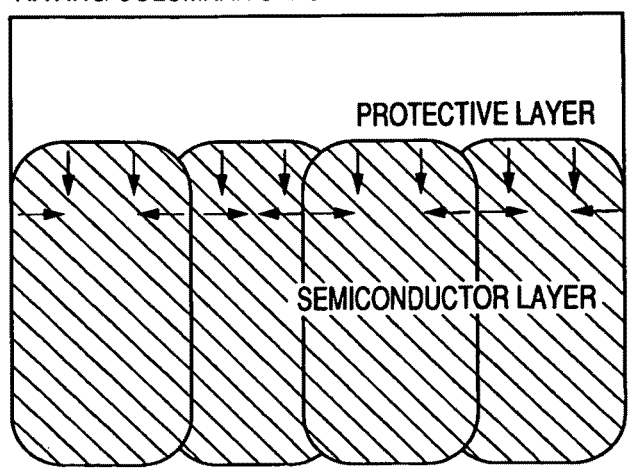

FIGS. 4A and 4B are schematic sectional views illustrating a manner in which the oxidation of a semiconductor layer progresses. FIG. 4A illustrates a semiconductor layer having no columnar structure and FIG. 4B illustrates a semiconductor layer having a columnar structure. As shown in FIG. 4A, the oxidation progresses only in the direction of film thickness when the semiconductor layer has no columnar structure. On the contrary, when the semiconductor layer has a columnar structure as shown in FIG. 4B, the oxidation progresses not only in a film thickness direction, but also in a radial direction to the inside of the column from a boundary region of the columnar structure, which is oxidized at a higher speed.

Due to this effect, a speed at which the semiconductor layer is oxidized from the surface is promoted, when a protective layer is deposited on the semiconductor layer, and a damaged layer formed in the semiconductor layer when the protective layer is formed is oxidized to be passivated.

The columnar structure in the amorphous can be confirmed by observing the cross section of the TFT with the use of a TEM (transmission electron microscope), for instance. However, it is necessary to defocus the TEM image intentionally, which is different from a normal observation method. The phase of an electron beam changes which has been incident on a solid.

The amount of the phase change is different between a portion having low density as in the boundary region of the columnar structure in the amorphous and the inner part of the columnar structure. The phase difference produces a contrast (phase contrast), and the boundary of the columnar structure is observed as an image with high brightness in under-focus, and is observed as an image with low brightness in over-focus.

The columnar structure can also be confirmed with a STEM-HAADF (Scanning TEM-high angle annular dark field) image. A dark field image by STEM is formed by measuring the intensity of electrons scattered in a sample while scanning a thinly squeezed electron beam on the sample.

An HAADF image is obtained by detecting electrons only scattered at a high angle among the above electrons with an annular detector and forming the image. The electron scattered at the high angle originates mainly in Rutherford scattering, the scattering intensity is proportional to the square of the atomic number of target atom (Z contrast).

Accordingly, the HAADF image shows a contrast which reflects a composition and mass thickness, so that the columnar structure having the boundary having low density can be confirmed by the HAADF image.

A display apparatus can be formed by connecting a source electrode or a drain electrode which is an output terminal of the above described TFT to an electrode of a light-emitting device or an optical switching device.

An example of a configuration of a specific display apparatus according to the present invention will now be described below with reference to a sectional view of the display apparatus.

Figure 3:
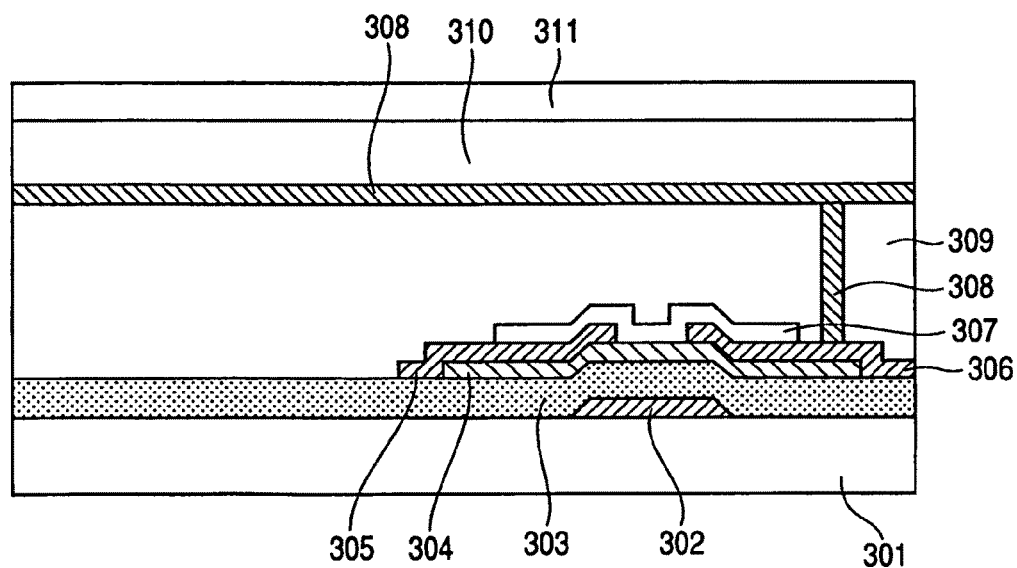
FIG. 3 is a sectional view of an example of a display apparatus, which is one embodiment of the present invention.

FIG. 3 is a schematic sectional view illustrating an example of a display apparatus using an organic EL as a light-emitting device, as one embodiment according to the present invention.

A TFT is formed on a substrate 301, which is constituted by a gate electrode 302, a gate insulation layer 303, a semiconductor layer 304, a drain electrode 305, a source electrode 306 and a protective layer 307.

A lower electrode 308 is connected to the source electrode 306 through an interlayer insulation film 309. The lower electrode 308 contacts a light-emitting layer 310, and the light-emitting layer 310 contacts an upper electrode 311. Here, the lower electrode 308, the light-emitting layer 310 and the upper electrode 311 constitute an organic EL device.

Due to such a configuration, the value of an electric current flowing from the drain electrode 305 to the source electrode 306 through a channel formed in the semiconductor layer 304 can be controlled by means of a voltage applied to the gate electrode 302 of TFT. Accordingly, an electric current to be injected into the light-emitting layer 310 of the organic EL device can be controlled.

The present invention will now be described below with reference to exemplary embodiments in more detail, but the present invention is not limited to these exemplary embodiments.

EXAMPLES

Example 1

In the present Example, a TFT including a columnar structure in a semiconductor layer will now be described below.

A bottom gate type TFT provided with a protective layer as illustrated in FIG. 2 is prepared with the use of a glass substrate.

At first, a metallic multilayer film including Ti of 5 nm, Mo of 40 nm and Ti of 5 nm is formed on the glass substrate with a sputtering technique which uses a Ti target and an Mo target. This metal film is patterned with a photolithographic technique to be formed into a gate electrode.

A film of amorphous $SiO_x$ of 200 nm is formed thereon with the sputtering technique which uses $SiO_2$ as the target, and is formed into a gate insulation layer. At this time, Ar is used as a sputtering gas.

An amorphous oxide semiconductor film of 40 nm including In—Zn—Ga—O is formed thereon with the sputtering technique which uses In—Zn—Ga—O as the target. A semiconductor layer is then formed by patterning the semiconductor film with the photolithographic technique and a wet etching technique.

Then, a metal film including Ti of 5 nm, Mo of 100 nm and Ti of 5 nm is formed with the sputtering technique which uses a Ti target and an Mo target as the targets. The metal film is patterned with the photolithographic technique and is formed into the source electrode and the drain electrode.

A film of amorphous $SiO_x$ of 100 nm is formed thereon with the sputtering technique which uses $SiO_2$ as the target, and is formed into a protective layer 7. At this time, the film for the protective layer is formed in an oxidative atmosphere by using a mixture gas of oxygen and Ar gas mixed with a ratio of 50% as a sputtering gas.

Furthermore, the TFT is subjected to a heat treatment in a nitrogen gas atmosphere containing 20% oxygen at 250° C. for one hour.

Thus, the bottom gate type TFT provided with the protective layer as illustrated in FIG. 2 is completed.

Figure 5A:
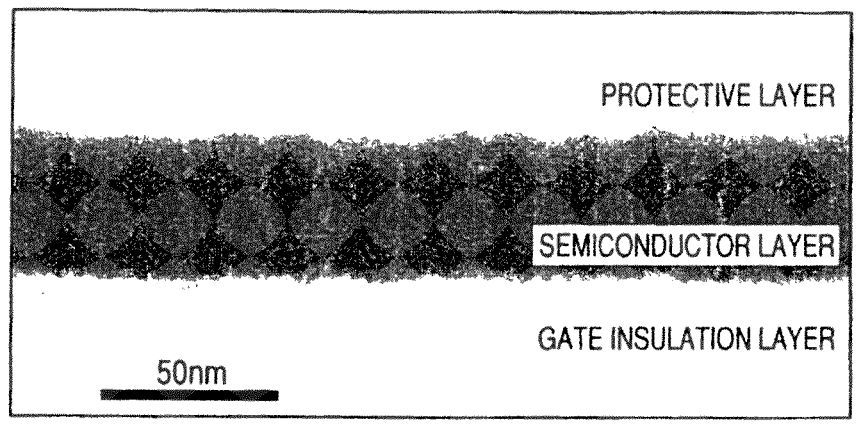
FIGS. 5A and 5B are respectively a TEM photograph of a cross section illustrating a columnar structure of a semiconductor layer in a TFT which is Exemplary embodiment 1 according to the present invention, and a schematic illustration thereof.
Figure 5B:
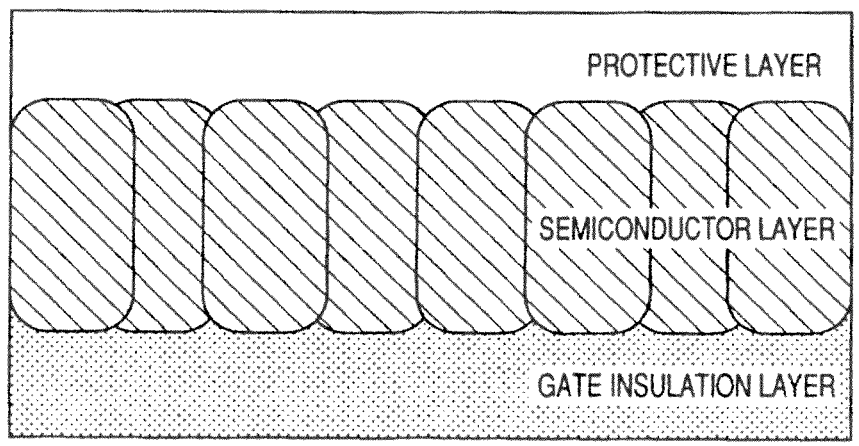

FIG. 5A illustrates a TEM photograph of the cross section of thus prepared TFT. Here, in the TEM photograph, a semiconductor layer is observed which is sandwiched between the gate insulation layer and the protective layer. A columnar structure with a diameter of approximately 10 to 20 nm is formed in the semiconductor layer due to unevenness on the gate insulation layer of the underlayer. FIG. 5B is a schematic illustration of the TFT.

Figure 6:
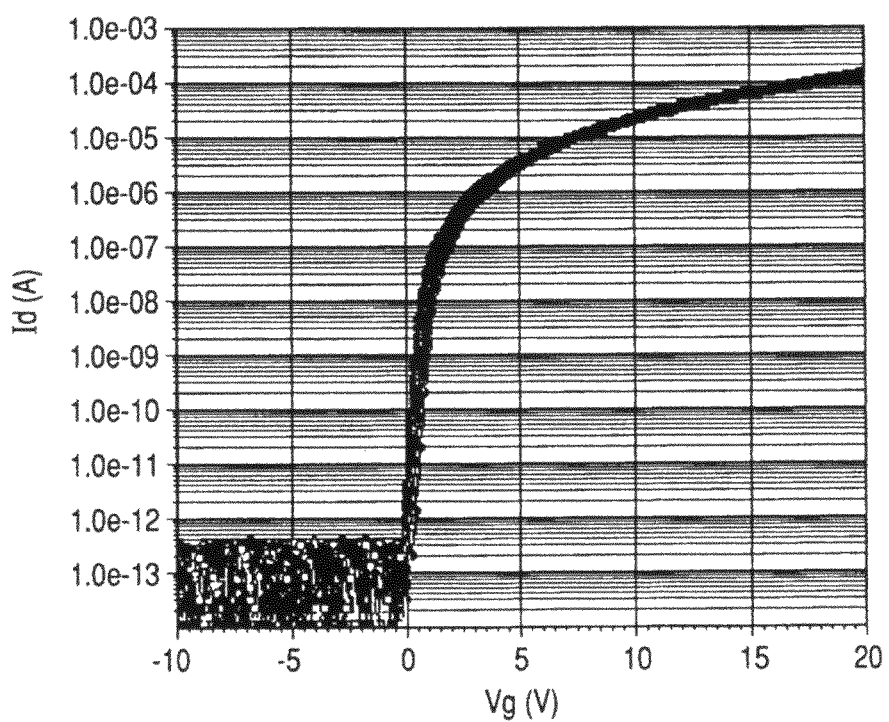
FIG. 6 illustrates transfer characteristics of 96 pieces of bottom gate type TFTs provided with a protective layer, which have a columnar structure in a semiconductor layer.

FIG. 6 illustrates transfer characteristics (Id-Vg characteristics) of 96 pieces of bottom gate type TFTs which have a columnar structure in the semiconductor layer and are provided with a protective layer. In FIG. 6, Id denotes drain current (A) and Vg denotes gate voltage (V). As shown in the same Figure, the obtained TFTs exhibit highly uniform characteristics with small dispersion.

Figure 7:
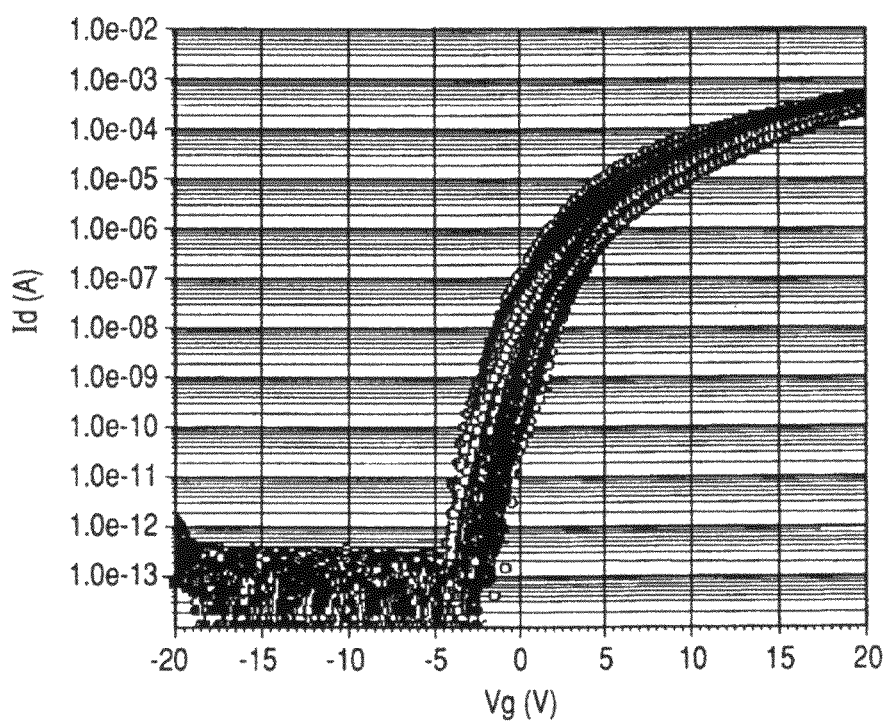
FIG. 7 illustrates transfer characteristics of 96 pieces of bottom gate type TFTs provided with a protective layer, in which a columnar structure of a semiconductor layer is not confirmed.

FIG. 7 illustrates transfer characteristics (Id-Vg characteristics) of 96 pieces of bottom gate type TFTs which have no columnar structure (non-confirmable) in the semiconductor layer and are provided with the protective layer. In the TFTs, a thermal oxidation Si with a smooth surface is used for the gate insulation layer, so that the columnar structure is not confirmed in the semiconductor layer. It is understood from the same Figure that the TFTs show an obviously large dispersion of the characteristics compared to TFTs having the columnar structure in the semiconductor layer illustrated in FIG. 6.

FIG. 8 is Table in which the dispersions of characteristics for 96 pieces of TFTs are compared by a standard deviation of voltages ($V_{on}$) when electric currents rise up, which are shown in the transfer characteristics. Here, $V_{on}$ represents a value of gate voltage ($V_g$) when $10^{-10}$ amperes of a drain current ($I_d$) start flowing. According to this, the TFT in which the columnar structure is not confirmed increases the dispersion of $V_{on}$ by being provided with the protective layer. On the other hand, in a TFT having the columnar structure according to the present invention, the dispersion of $V_{on}$ is controlled into a low value, even after having been provided with the protective layer.

Thus, according to the configuration of the present invention, a TFT of high uniformity can be prepared even when the protective layer is formed therein.

Example 2

In the present Example, a TFT including a semiconductor layer made of a first layer having high mass density and a second layer having low mass density will now be described below.

A bottom gate type TFT provided with a protective layer as illustrated in FIG. 9 is prepared with the use of an n-type Si substrate.

At first, a thermal oxidation Si film (gate insulation film 93) is formed in a thickness of 100 nm on an n-type Si substrate 92. In FIG. 9, an independent gate electrode is not provided, but the n-type Si substrate 92 functions as a gate electrode. An amorphous oxide semiconductor film (first layer) including In—Zn—Ga—O is formed thereon into 30 nm with a sputtering technique which employs In—Zn—Ga—O as a target and room temperature as a substrate temperature. Furthermore, an amorphous oxide semiconductor film (second layer) including In—Zn—Ga—O is formed thereon into 10 nm with a PLD technique which employs room temperature as a substrate temperature. The two amorphous oxide semiconductor films (first layer and second layer) are patterned with a photolithographic technique and a wet etching technique and are formed into a semiconductor layer 94.

Subsequently, a metal film including Ti of 5 nm, Mo of 100 nm and Ti of 5 nm is formed thereon with the sputtering technique which uses a Ti target and an Mo target as the targets. This metallic film is patterned with the photolithographic technique and is formed into a source electrode and a gate electrode.

A film of amorphous $SiO_x$ is formed into 100 nm thereon with the sputtering technique which uses $SiO_2$ as the target and is made to be a protective layer 97. At this time, the film for the protective layer 97 is formed in an oxidative atmosphere by using a mixture gas of oxygen and Ar gas mixed with a ratio of 50% as a sputtering gas.

Furthermore, the TFT is subjected to a heat treatment in a nitrogen gas atmosphere containing 20% oxygen at 250° C. for one hour.

Thus, the bottom gate type TFT is completed which employs the n-type Si substrate and is provided with the protective layer as illustrated in FIG. 9.

(Difference of Density According to Film-Forming Process)

Concerning the above TFT, the difference in the mass density of the amorphous oxide semiconductor film according to the difference in the film-forming process will be investigated below.

First, an investigation is made on the case where only a sputtering method is used as the film-forming method. A thermal oxidation Si film is formed in a thickness of 100 nm on an n-type Si substrate, and an amorphous oxide semiconductor film including In—Zn—Ga—O is formed thereon only with a sputtering technique which employs a room temperature as the substrate temperature, a RF power of 300 W and a film-forming pressure of 0.5 Pa.

The composition of the amorphous oxide semiconductor film thus obtained is examined with a X-ray fluorescence analysis and the mass density is determined from X-ray reflectometry. Then, the obtained value shows 93.7% with respect to the mass density in the crystal state shown in FIG. 1.

Similarly, a thermal oxidation Si film is formed in a thickness of 100 nm on an n-type Si substrate, and an amorphous oxide semiconductor film including In—Zn—Ga—O is formed thereon only with a PLD technique which employs a room temperature as the substrate temperature and an oxygen pressure of 6 Pa while irradiating a target pellet with a concentrated KrF excimer laser having a power of 20 mJ. When the mass density of the amorphous oxide semiconductor film thus obtained is measured, the obtained value shows 83.7% with respect to the mass density in the crystal state shown in FIG. 1.

Accordingly, a TFT including a semiconductor layer made of a first layer having high mass density and a second layer having a low mass density can be prepared by combining the sputtering technique with the PLD technique.

Example 3

In the present Example, a display apparatus using a TFT in FIG. 3 will now be described.

A TFT is manufactured in a process similar to that in Example 1.

After the TFT has been prepared, an interlayer insulation film 309 is formed. At this time, a contact hole for connecting a drain electrode 305 with a lower electrode 308 is formed.

Subsequently, a lower electrode 308 is formed thereon by forming a film of Al with an electron beam vapor deposition technique. The lower electrode 308 is connected with the drain electrode 305 through the contact hole.

Next, an electron transport layer, a light-emitting layer, a hole transport layer, a hole injection layer are sequentially formed with a vapor deposition technique, which form an organic EL light-emitting layer as a whole.

Finally, an upper electrode 311 is formed thereon by forming a film of ITO with a sputtering technique.

Here, when voltage is applied to a source electrode 306 of the TFT and voltage applied to a gate electrode 302 is changed, an electric current is injected into the light-emitting layer 310 from the drain electrode 305 through the lower electrode 308, and can drive an organic EL device.

In this way, a display apparatus using the organic El device can be formed.

The above embodiments and examples describe the applications to bottom gate type TFTs, to which the present invention is not necessarily limited. The present invention can be applied even to top gate type TFTs as long as the TFTs have a configuration in which part of a protective layer is provided on a semiconductor layer in contact with the semiconductor layer.

While the present invention has been described with reference to exemplary embodiments and the examples, it is to be understood that the invention is not limited to the disclosed exemplary embodiments and examples. It will be also appreciated that many other embodiments of the invention may be possible without departing from the spirit or scope of the invention as defined in the claims.

This application claims the benefit of Japanese Patent Applications No. 2007-254364, filed Sep. 28, 2007 and No. 2008-196038, filed Jul. 30, 2008, which are hereby incorporated by reference herein in their entirety.

The invention claimed is:

1. A thin film transistor comprising:
   a gate electrode;
   a gate insulation layer;
   a semiconductor layer formed of an amorphous oxide semiconductor by sputtering;
   a source electrode;
   a drain electrode; and
   a protective layer formed in an oxidative atmosphere,
   wherein said protective layer is provided on said semiconductor layer in contact with said semiconductor layer, and
   wherein said semiconductor layer includes a first layer at least functioning as a channel layer and a second layer having higher resistance than said first layer, said second layer being provided on the protective layer side of said semiconductor layer, and said second layer containing a columnar structure of columns surrounded by boundaries which have lower mass density than the columns such that said second layer has a mass density not larger than the mass density of said first layer.

2. The thin film transistor according to claim 1, wherein said columnar structure comprises columns having an average diameter not larger than $2/3$ of the thickness of the amorphous semiconductor layer.

3. The thin film transistor according to claim 1, wherein said amorphous oxide semiconductor contains at least one of In, Zn and Ga.

4. The thin film transistor according to claim 1, wherein said first layer is provided on the gate electrode side of said semiconductor layer.

5. A display comprising the thin film transistor according to claim 1 as a switching device.

6. A method for manufacturing a thin film transistor comprising a gate electrode, a gate insulation layer, a semiconductor layer formed of an amorphous oxide semiconductor, a source electrode, a drain electrode and a protective layer, the method comprising the steps of:
   forming the gate electrode;
   forming the gate insulation layer;
   forming the semiconductor layer by sputtering;
   forming the source electrode and the drain electrode; and
   forming the protective layer in an oxidative atmosphere,
   wherein the semiconductor layer includes a first layer at least functioning as a channel layer and a second layer provided on the protective layer side of the semiconductor layer, the second layer containing a columnar structure of columns surrounded by boundaries which have lower mass density than the columns such that the second layer has a mass density not larger than the mass density of the first layer structure, and
   wherein after forming of the protective layer, the second layer has higher resistance than the first layer.

* * * * *